United States Patent
Yamanobe et al.

(10) Patent No.: US 6,518,503 B1
(45) Date of Patent: Feb. 11, 2003

(54) BENDING-RESISTANT FLEXIBLE FLAT CABLE AND PRODUCTION PROCESS THEREOF

(75) Inventors: Hiroshi Yamanobe, Ibaraki (JP); Takaaki Ichikawa, Ibaraki (JP); Seigi Aoyama, Ibaraki (JP); Tsutomu Komori, Ibaraki (JP); Hidenori Kobayashi, Ibaraki (JP); Masato Ito, Ibaraki (JP); Katsuo Endo, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/046,271

(22) Filed: Jan. 16, 2002

(30) Foreign Application Priority Data

Jul. 16, 2001 (JP) ........................................ 2001-215534

(51) Int. Cl.$^7$ ................................................. H01B 7/08
(52) U.S. Cl. ................................................. 174/117 FF
(58) Field of Search ........................ 174/117 F, 117 FF, 174/117 A

(56) References Cited

U.S. PATENT DOCUMENTS 3,168,617 A * 2/1965 Richter ......................... 156/47
6,049,041 A * 4/2000 Yoshioka et al. ...... 174/117 FF

* cited by examiner

*Primary Examiner*—Chau N. Nguyen
(74) *Attorney, Agent, or Firm*—Foley & Lardner

(57) ABSTRACT

In FFC1 integrated by sandwiching flat type conductors 2 between plastic films 3 with adhesives, wherein the conductors are formed of pure copper or a copper alloy having a wiredrawing draught of at least 95% and an elongation of at least 5%, and the plastic films with adhesives are formed of one having a modulus of longitudinal elasticity of at least 280 kg/mm$^2$ and an elongation of at least 80%, and the 180° peel strength between the adhesives and the conductors 2 is made to be at least 0.8 kg/cm. As a result, even if the number of conductors 2 is increased than the conventional FFC, bending-resistant characteristic equal to or higher than the conventional FFC can be exhibited.

8 Claims, 3 Drawing Sheets

BENDING-RESISTANT FLEXIBLE FLAT CABLE AND PRODUCTION PROCESS THEREOF

BACKGROUND OF THE INVENTION

1. Field of the Invention

The present invention relates to a bending-resistant flexible flat cable (hereinafter referred to as FFC) widely used as a wiring material for movable parts in circuits of electric and electronic equipments, and the production process thereof.

2. Prior Art

The FFC heretofore widely used as a wiring material for movable parts in circuits of electric and electronic equipments is a wire in a thin tape form having a thickness of about 0.3 mm, as shown in FIG. 1 to FIG. 3. This FFC is manufactured by feeding straight a conductor group "$2a$" formed by a singular to several tens of conductors "$a$" arranged parallel with each other, putting this conductor group $2a$ between nonconductive plastic films "$b$" with adhesives from upper and lower side thereof, and laminating this with a pair of upper and lower hot rolls "$c$".

A nonconductive plastic tape "$e$" is passed through an adhesive tank "$d$", so that the plastic film "$b$" of the upper side is obtained in accordance with the coating of adhesive at least on an inner surface of the plastic tape "$e$".

Such a FFC in a tape form has normally excellent flexibility. Hence, this is necessary and indispensable, particularly as a wiring material for cable reel type rotating connectors of automobile airbags, other than wiring materials for movable parts in circuits of electric and electronic equipments.

This is used by storing the FFC in a curled or U-shaped form in a steering case, wherein bending life of about $1\times10^6$ to $5\times10^6$ is required in the bending radius R of from 5 to 15 mm in the temperature range of about −40 to 85° C. (the U-shaped sliding and bending test: in accordance with JIS-C5016).

Recently, automobile airbags having high functions such as it finely controlling the way of swelling of the airbag depending on the energy at the time of collision or the weight of a driver have been developed, which entail a so-called multi-conductor FFC, in which the number of conductors is increased to higher than twice the number in the related art. However, as shown in FIG. 4, if the number of conductors is simply increased, the width of the cable increases, and the steering case or the like for storing this becomes also large. Therefore, it can be considered to thin the conductor itself, without changing the width of the cable. However, since heavy current of several amperes is normally applied to the FFC for automobile airbags, generation of heat attributable to an increase in the conductor resistance becomes large, with a decrease of a sectional area of the conductor due to thinning.

Therefore, in order to achieve multi-conductor cables without changing the cable width and the conductor resistance from those of the related art, it is necessary to ensure the same sectional area as that in the related art, by making the thickness of the cable thick and making the conductor thick in the thickness direction.

However, if the thickness of the cable and the conductor is made thicker than that of the conventional FFC, there is caused a problem in that the flexibility which is the largest feature of the flat cable decreases considerably. For example, if the conductor thickness of the FFC is made twice as thick as that of the conventional FFC, the flexibility thereof generally decreases up to one tenth or below, and hence the flexibility required for the FFC for automobile airbags cannot be satisfied.

SUMMARY OF THE INVENTION

The present invention has been proposed in order to effectively solve such problems, and it is an object of the present invention to provide a new bending-resistant flexible flat cable that can exhibit flexibility equal to or higher than that of the conventional FFC, even if the number of conductors is increased, and the production process thereof.

In order to solve the above problems, the present invention is a bending-resistant flexible flat cable integrated by sandwiching a single or a plurality of flat type conductors between plastic films with adhesives, wherein the conductor is formed of pure copper having a wiredrawing draught of at least 95% and elongation of at least 5%, or a solution-type high-conductivity copper alloy having a conductivity of at least 70%, the plastic film with adhesives is formed of one having a modulus of longitudinal elasticity of at least 280 kg/mm$^2$ and an elongation of at least 80%, and the 180° peel strength between the adhesives of the plastic films with adhesives and the conductor is made to be at least 0.8 kg/cm.

As a result, even if the number of conductors is doubled, while keeping the current value of the conductor resistance, the bending-resistant characteristic equal to or higher than that of the conventional FFC can be exhibited.

EMBODIMENTS OF THE INVENTION

One preferable embodiment of the present invention will now be described with reference to the accompanying drawings.

Figure 5:
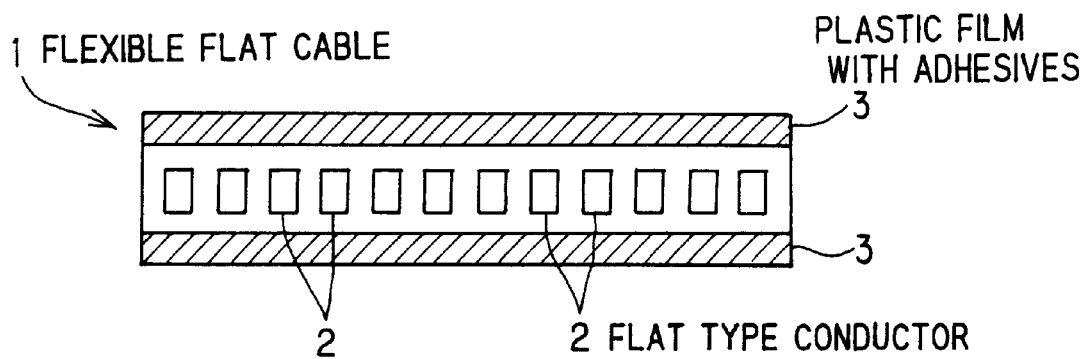
FIG. 5 is an enlarged sectional view showing one embodiment of a bending-resistant flexible flat cable according to the present invention.

FIG. 5 is an enlarged sectional view showing one embodiment of a bending-resistant FFC1 for automobile airbags according to the present invention.

As shown in this figure, this FFC1 is formed by sandwiching a plurality of flat type conductors 2, 2 . . . arranged at the same pitch between a pair of plastic films 3 with adhesives from upper and lower sides thereof. The cable width thereof is substantially the same as that of the conventional FFC for automobile airbags, but the number and the thickness of the conductors 2 are nearly doubled compared to those of the conventional FFC to thereby form a narrow-pitch multi conductors.

This flat type conductor 2 is formed of pure copper such as OFC (oxygen-free copper) or TPC (tough pitch copper), or a cheap solution-type high-conductivity copper alloy having a conductivity of at least 70%, similar to that of the related art. The wire drawing draught thereof has heretofore been 80 to 90%, but in the present invention, a copper alloy annealed and refined so as to have an elongation of 5% or more, after high processing of at least 95%, and preferably, at least 99%, is used. That is to say, the reason why the elongation of this conductor 2 is defined as 5% or more is that in the case of applying this conductor for automobile airbags, in many cases, the vicinity of the end portion thereof is bent for use, and hence, if the elongation of the conductor 2 is less than 5%, the conductor 2 cannot endure the flexural strain at the time of bending the end portion, and there is a possibility of a rupture. Moreover, the reason why the conductivity of this conductor 2 is defined as at least 70% is to solve problems caused by an increase of the thickness of the conductor 2, with an increase of conductivity, if it is assumed that the resistance is constant, for example, (1) since the flexural rigidity of the conductor 2 increases in proportion to the cube of the thickness thereof, the flexibility as the FFC considerably decreases; (2) since the FFC is used in many cases by bending the vicinity of the end portion thereof, the bending resistance of the FFC considerably decreases with an increase of the thickness of the conductor 2; and (3) the weight of the FFC increases.

This flat type conductor 2 has preferably a width of from 0.3 to 1.0 mm and a thickness of from 50 to 100 $\mu$m. As the production process thereof, for example, after a round bus bar having a diameter of about 8 mm is subjected to cylindrical dies wire drawing to substantially the same area as that of the final shape without annealing, the obtained intermediate material is subjected to precise rectangular rolling, annealing and refining to the final geometry, to thereby obtain this flat type conductor very easily.

This wiredrawing draught is defined by the following expression:

Wiredrawing draught=(1−sectional area of flat type conductor/
sectional area of round bus bar)×100(%).

As this solution-type high-conductivity copper alloy, there is used a copper alloy in which at least one kind of Sn or In is added in Cu in a small amount of from 0.05 to 0.5% in total.

On the other hand, the plastic films 3 with adhesives have heretofore had a modulus of longitudinal elasticity of from about 200 to 230kg/mm², but in the present invention, a plastic film having a modulus of longitudinal elasticity of at least 280 kg/mm², and preferably at least 300 kg/mm², and having an elongation of at least 80%, and preferably at least 100% is used. That is to say, if the modulus of longitudinal elasticity is less than 280 kg/mm², and the elongation is less than 80%, the flexibility equal to that of the conventional FFC cannot be obtained. Elongation referred to herein is an elongation value at which a film is not peeled off from the adhesives, or a crack does not occur in the adhesives, during a tensile test of the film with adhesives. Moreover, in the FFC for automobile airbags, since there may be a case where the temperature of use environment reaches 85° C. at maximum, and may reach 100° C. according to circumstances. Therefore, it is desired to add, in the adhesives, a thermoplastic and a flame retardant, and further a thermal crosslinking agent (thermosetting agent) in view of heat resistance. Specifically, there can be mentioned polyethylene terephthalate (PET), polyethylene naphthalate (PEN), polyphenylene sulfide (PPS) or polyetherimide (PEI), with flame retardant polyester type adhesives. Among these, in view of the cost aspect, it is desired to use PET, but if giving much weight to the flexuous property, it is desired to use PEN or PPS having higher elasticity than PET. Also, since PEI itself has excellent self extinguish, if this PEI is used, it becomes possible to decrease the amount of use of the flame retardant in the adhesives which decreases the bending-resistant characteristic, thereby excellent bending-resistant characteristic can be exhibited.

Moreover, the 180° peel strength between the conductor 2 and the adhesives is at least 0.8 kg/cm, and preferably at least 1.0 kg/cm. It is because if it is less than 0.8 kg/cm, problems such as peeling may occur with repeated bending. This 180° peel strength is determined by the tensile test (at a rate of 20 mm/min.) of the conductor in an exposed portion thereof at the end of the FFC.

In the case of FFC1 of the present invention, as demonstrated in the Examples described below, even if the conductors 2 are arranged in a narrow pitch and the number thereof is considerably increased compared to the conventional FFC, accompanying the high-function airbags, excellent bending-resistant characteristic equal to or higher than that of the conventional FFC can be exhibited, without causing problems such as an increase of electric resistance.

Figure 1:
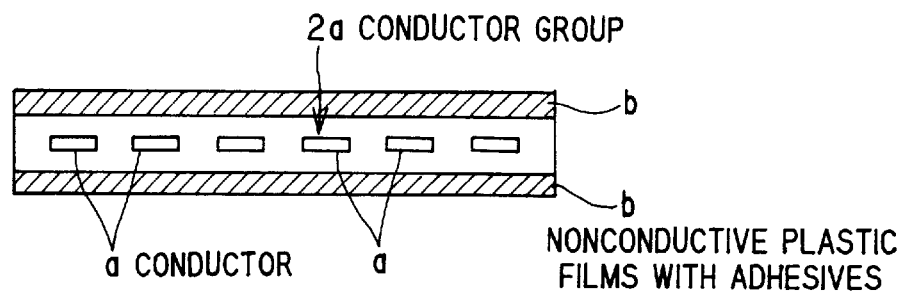
FIG. 1 is an enlarged sectional view showing one embodiment of a conventional flexible flat cable.
Figure 2:
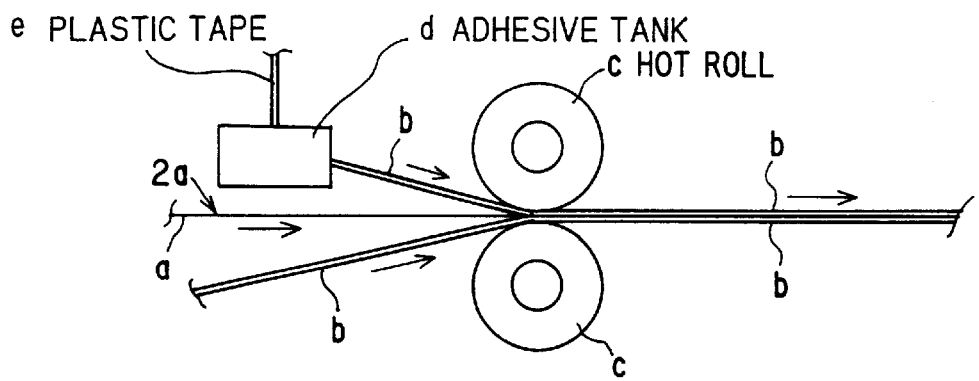
FIG. 2 is a conception diagram showing a production process of a conventional flexible flat cable.
Figure 3:
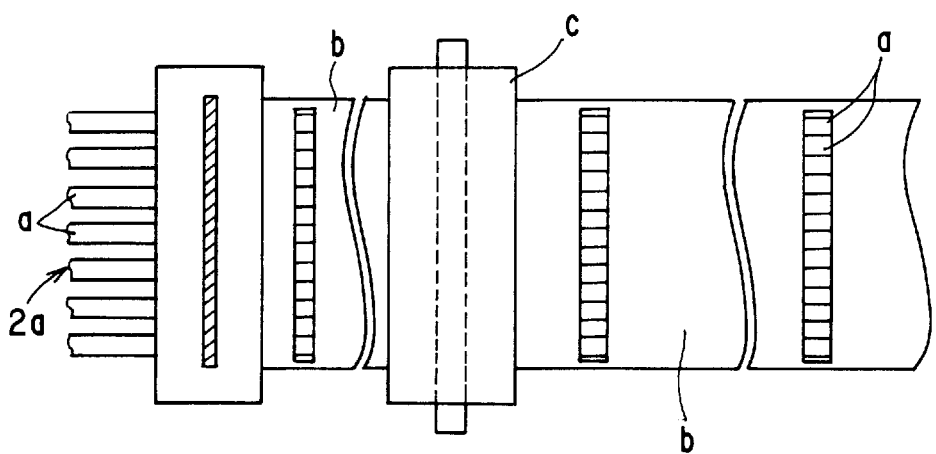
FIG. 3 is a conception diagram showing the production process in FIG. 2, as seen from above.
Figure 4:
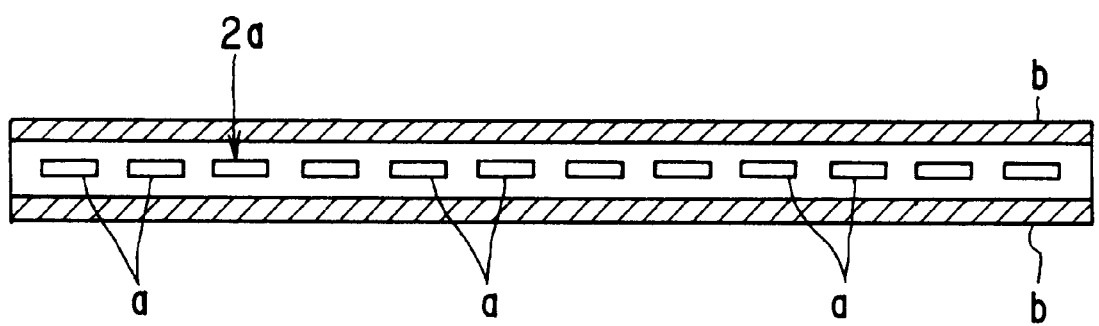
FIG. 4 is a conception diagram showing one example in which the number of conductors of a conventional flexible flat cable is simply doubled.

With such a production process of FFC, as in the related art shown in FIG. 1 and FIG. 2, after thermocompression bonding of the conductor 2 and the plastic films 3 with adhesives with hot rolls, the adhesives are cured in a heating furnace such as oven for several hours to tens of hours, thereby enabling easy production. Also the FFC1 of the present invention is applicable as a harness for automobile doors which requires bending resistance, and by application of this FFC1, the harness can be formed in multi-circuits and in light weight.

EXAMPLES

In order to verify the effects of the present invention, several types of FFCs different in the processing conditions of conductors and in the mechanical properties of the adhesives of the plastic film were made for trial purposes, as shown in Table 1 and Table 2 below, and the bending-resistant characteristics thereof were evaluated.

As the plastic films with adhesives used herein, PET (polyethylene terephthalate) with flame retardant polyester type adhesives having different modulus of longitudinal elasticity and elongation was used for each case, and the thickness of PET was designated as 50 $\mu$m and the thickness of the adhesives was designated as 30 $\mu$m (including the thickness of anchor coat).

Figure 6:
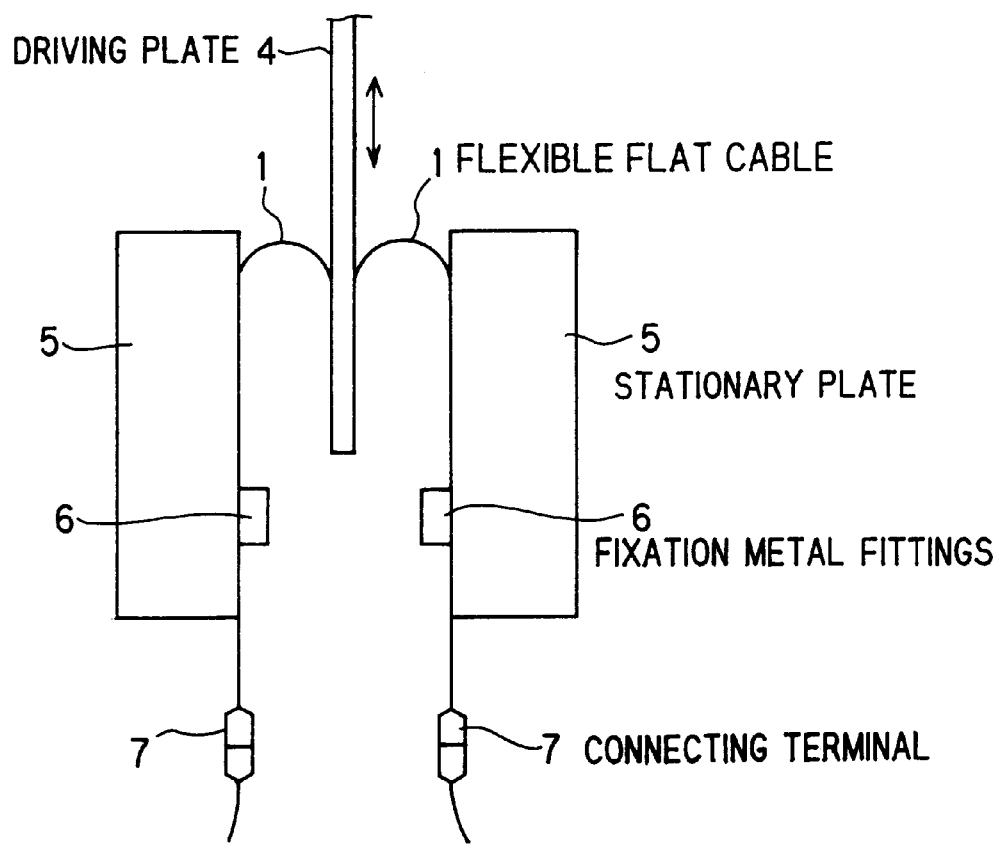
FIG. 6 is a diagram showing a method of evaluating the bending-resistant characteristic adopted in this example.

The evaluation method of this bending-resistant characteristic is in accordance with JIS-C5016. As shown in FIG. 6, the obtained FFC1 is bent in a U-shape, with one end being attached to the tip of a driving plate 4, and the other end being fixed to stationary plates 5, using fixation metal fittings 6, then the driving plate 4 is repeatedly reciprocated in constant strokes in the direction of arrows in the figure, and the fatigue life until the conductors in the FFC1 have been cut is measured by a detection apparatus (not shown). In the figure, reference numeral 7 denotes a terminal for connecting the end of the FFC1 with the disconnection detection apparatus.

The specific conditions in this evaluation are as follows:
Bending life measuring conditions
  Bending speed V: 1500 rpm
  Stroke S: 25 mm
  Distance H between parallel flat boards: 16 mm (corresponding to bend radius R=8 mm)
  Environmental temperature: 23° C.
  Detection of bending life: number of times until the energizing current of the conductor for a monitor stops for more than $10^{-6}$ seconds or the conductor resistance is increased by 10% from the initial state Pass or fail condition of bending life: higher than the conventional conditions On the other hand, the mechanical properties of the plastic film with adhesives, which vary largely depending on the measuring conditions, were measured by a tensile tester under the conditions of a gage length of 30 mm, a sample width of 10 mm, and an elastic stress rate of 4mm/min.

Examples

As shown in Table 1, twelve conductors having a wiredrawing draught of at least 95% and an elongation of at least 5% were used, which were sandwiched between plastic films with adhesives having a modulus of longitudinal elasticity of at least 280 kg/mm² and an elongation of at least 80%, with the stroke width and the pitch being 0.5 mm and 1.0 mm, respectively, and were subjected to thermo compression bonding. Thereafter, the adhesives were cured in a heating furnace such as oven for several hours to tens of hours, to thereby prepare ten kinds of FFC samples for tests, and the respective bending lives were evaluated on the basis of the bending life of the FFC samples for tests according to the related art described below.

Related art

As shown in the column (No. 11) of the related art in Table 2 described below, FFC samples for tests were prepared in the same manner as that of the Examples, with the exception that six conductors having a wiredrawing draught of 85% and an elongation of 26% were used, which were sandwiched between plastic films with adhesives having a modulus of longitudinal elasticity of 218 kg/mm² and an elongation of 132%, with the stroke width and the pitch being 1.0 mm and 2.0 mm, respectively, and the respective bending lives were evaluated.

Comparative Examples

As shown in the columns (No. 12 to No. 17) of Comparative Examples in Table 2 described below, six kinds of FFC samples for tests were prepared in the same manner as that of the Examples, with the exception that conductors having a wiredrawing draught of at least 85% and an elongation of at least 23% were used, which were sandwiched between plastic films with adhesives having a modulus of longitudinal elasticity of 218 to 320 kg/mm² and an elongation of 45 to 132%, and the respective bending lives were evaluated.

TABLE 1

| FFC characteristics | | Examples (present invention) | | | | | | | | | |
|---|---|---|---|---|---|---|---|---|---|---|---|
| | | No. 1 | No. 2 | No. 3 | No. 4 | No. 5 | No. 6 | No. 7 | No. 8 | No. 9 | No. 10 |
| Conductors | Material | OFC | Cu-0.15% Sn | Cu-0.2% Sn-0.1% In | OFC | OFC | OFC | OFC | OFC | OFC | OFC |
| | Wiredrawing draught (%) | 95 | 95 | 95 | 99 | 99.9 | 95 | 95 | 95 | 95 | 95 |
| | Width (mm) | | | | | 0.5 | | | | | |
| | Thickness (μm) | 70 | 80 | 90 | 70 | 70 | 70 | 70 | 70 | 70 | 70 |
| | Tensile strength (kg/mm²) | 23 | 28 | 32 | 22 | 24 | 35 | 28 | 23 | 23 | 23 |
| | Elongation (%) | 25 | 23 | 22 | 22 | 18 | 7 | 14 | 25 | 25 | 25 |
| Films with adhesives | Modulus of longitudinal elasticity (kg/mm²) | 285 | 285 | 285 | 285 | 285 | 285 | 285 | 337 | 320 | 318 |
| | Elongation (%) | 120 | 120 | 120 | 120 | 120 | 120 | 120 | 82 | 94 | 103 |
| FFC samples for test | Number of cores, Lateral width, Pitch | | | | | 12 0.5 mm 1.0 mm | | | | | |
| | 180° peel strength (kg/cm) | 1.2 | 1.2 | 1.2 | 1.2 | 1.2 | 1.2 | 1.2 | 1.1 | 0.9 | 0.8 |
| | Bending life* | ○ | ○ | ○ | ○ | ○ | ○ | ○ | ○ | ○ | ○ |

*Bending life was obtained by comparison with No. 11 (○: equal to or higher than that of No. 11, X: less than that of No. 11)

TABLE 2

| FFC characteristics | | Related art | Comparative Examples | | | | | |
|---|---|---|---|---|---|---|---|---|
| | | No. 11 | No. 12 | No. 13 | No. 14 | No. 15 | No. 16 | No. 17 |
| Conductors | Material | OFC | OFC | OFC | OFC | OFC | Cu.0.15% Sn | Cu.0.15% Sn |
| | Wiredrawing draught (%) | 85 | 85 | 95 | 95 | 95 | 85 | 95 |
| | Width (mm) | 1.0 | | | | 0.5 | | |
| | Thickness (μm) | 35 | 70 | 70 | 70 | 70 | 80 | 80 |
| | Tensile strength (kg/mm²) | 24 | 24 | 23 | 23 | 23 | 29 | 28 |
| | Elongation (%) | 26 | 26 | 25 | 25 | 25 | 26 | 23 |
| Films with adhesives | Modulus of longitudinal elasticity (kg/mm²) | 218 | 285 | 218 | 320 | 313 | 285 | 218 |
| | Elongation (%) | 132 | 120 | 132 | 45 | 96 | 120 | 132 |

TABLE 2-continued

| FFC characteristics | | Related art No. 11 | Comparative Examples | | | | | |
|---|---|---|---|---|---|---|---|---|
| | | | No. 12 | No. 13 | No. 14 | No. 15 | No. 16 | No. 17 |
| FFC samples for test | Number of cores, Lateral width, Pitch | 6 1.0 mm 2.0 mm | | | | 12 0.5 mm 1.0 mm | | |
| | 180° peel strength (kg/cm) | 1.3 | 1.2 | 1.3 | 1.1 | 0.6 | 1.2 | 1.3 |
| | Bending life* | — | X | X | X | X | X | X |

*Bending life was obtained by comparison with No. 11 (○: equal to or higher than that of No. 11, X: less than that of No. 11)

As a result, as shown in the bottom column of Table 1, in the FFC sample for tests of each Example, the bending life thereof exhibited properties equal to or higher than those of the conventional FFC.

On the other hand, in No. 12 and No. 16 of Comparative Examples where the wiredrawing draught of the conductor (85%) was below the specified value of the present invention, in No. 13 and No. 17 where the modulus of longitudinal elasticity of the plastic film (218 kg/mm$^2$) was below the specified value of the present invention, in No. 14 where the elongation of the conductor (45%) was below the specified value of the present invention, and in No. 15 where the 180° peel strength (0.6 kg/cm) was below the specified value of the present invention, the bending life thereof was considerably inferior to that of the conventional FFC, respectively.

As a result, it has been verified that by using conductors consisting of pure copper having a wiredrawing draught of at least 95% and elongation of at least 5%, or a solution-type high-conductivity copper alloy having a conductivity of at least 70%, using plastic films with adhesives having a modulus of longitudinal elasticity of at least 280 kg/mm$^2$ and an elongation of at least 80%, and making the 180° peel strength between the adhesives of the plastic films with adhesives and the conductor at least 0.8 kg/cm, the bending-resistant characteristic becomes equal to or higher than that of the conventional FFC, even if the number of conductors is doubled, while keeping the current value of the conductor resistance.

Briefly speaking, according to the present invention, since, even when the number of circuits is increased up to two times while the current value of the conductor resistance is being maintained, the bending-resistant characteristic with the conventional value or more can be obtained, such an excellent effect can be achieved that a large contribution to a development of an airbag for an automobile having an excellent bending-resistant characteristic and a high function required for narrow pitch and multi-line orientation can be achieved and so on.

What is claimed is:

1. A bending-resistant flexible flat cable integrated by sandwiching a single or a plurality of flat type conductors between plastic films with adhesives, wherein said conductor is formed of pure copper having al wiredrawing draught of at least 95% and an elongation of at least 5%, or a solution-type high-conductivity copper alloy having a conductivity of at least 70%, said plastic films with adhesives are formed of one having a modulus of longitudinal elasticity of at least 280 kg/mm$^2$ and an elongation of at least 80%, and the 180° peel strength between the adhesives of the plastic films with adhesives and the conductor is made to be at least 0.8 kg/cm.

2. A bending-resistant flexible flat cable according to claim 1, wherein said solution-type high-conductivity copper alloy is a copper alloy in which at least one kind of Sn or In is added in Cu in an amount of from 0.05 to 0.5% in total.

3. A bending-resistant flexible flat cable according to claim 2, wherein said plastic films with adhesives comprise polyethylene terephthalate, polyethylene naphthalate, polyphenylene sulfide or polyetherimide, with flame retardant polyester type adhesives.

4. A bending-resistant flexible flat cable according to claim 2, wherein the adhesives of said plastic films with adhesives comprise a thermoplastic component, a thermal crosslinking component and a flame retardant component.

5. A bending-resistant flexible flat cable according to claim 1, wherein said plastic films with adhesives comprise polyethylene terephthalate, polyethylene naphthalate, polyphenylene sulfide or polyetherimide, with flame retardant polyester type adhesives.

6. A bending-resistant flexible flat cable according to claim 3, wherein the adhesives of said plastic films with adhesives comprise a thermoplastic component, a thermal crosslinking component and a flame retardant component.

7. A bending-resistant flexible flat cable according to claim 1, wherein the adhesives of said plastic films with adhesives comprise a thermoplastic component, a thermal crosslinking component and a flame retardant component.

8. A production process of a bending-resistant flexible flat cable comprising steps of: forming a flat type conductor having a wiredrawing draught of at least 95% and elongation of at least 5% from pure copper or a solution-type high-conductivity copper alloy having a conductivity of at least 70%; sandwiching a single said flat type conductor or a conductor group having a plurality of said flat type conductors arranged parallel with each other between nonconductive plastic films with adhesives having a modulus of longitudinal elasticity of at least 280 kg/mm$^2$ and an elongation of at least 80%, using hot rolls from the upper and lower sides thereof; and heating and curing the adhesives.

* * * * *